(12) United States Patent
Jung

(10) Patent No.: US 9,773,854 B2
(45) Date of Patent: Sep. 26, 2017

(54) DISPLAY DEVICE

(71) Applicant: SAMSUNG DISPLAY CO., LTD., Yongin-si, Gyeonggi-do (KR)

(72) Inventor: Sun-Kyo Jung, Cheonan-si (KR)

(73) Assignee: Samsung Display Co., Ltd., Yongin-si (KR)

(*) Notice: Subject to any disclaimer, the term of this patent is extended or adjusted under 35 U.S.C. 154(b) by 169 days.

(21) Appl. No.: 14/877,802

(22) Filed: Oct. 7, 2015

(65) Prior Publication Data

US 2016/0148562 A1 May 26, 2016

(30) Foreign Application Priority Data

Nov. 26, 2014 (KR) .................... 10-2014-0166440

(51) Int. Cl.
*H01L 33/62* (2010.01)
*H01L 27/32* (2006.01)
*H01L 51/52* (2006.01)

(52) U.S. Cl.
CPC ...... *H01L 27/3276* (2013.01); *H01L 51/5246* (2013.01); *H01L 27/3246* (2013.01); *H01L 51/529* (2013.01); *H01L 2251/558* (2013.01)

(58) Field of Classification Search
CPC ....... H01L 33/62; H01L 33/486; H01L 33/32; H01L 33/38; H01L 2924/01079
See application file for complete search history.

(56) References Cited

U.S. PATENT DOCUMENTS

| | | | |
|---|---|---|---|
| 6,933,537 B2 | 8/2005 | Yee et al. | |
| 8,363,304 B2* | 1/2013 | Tanaka | G02F 1/0107 359/245 |
| 8,415,880 B2 | 4/2013 | Choi et al. | |

FOREIGN PATENT DOCUMENTS

| | | |
|---|---|---|
| KR | 10-0529071 B1 | 11/2005 |
| KR | 10-0641738 B1 | 11/2006 |
| KR | 10-2011-0119163 A | 11/2011 |

* cited by examiner

*Primary Examiner* — Quoc Hoang
(74) *Attorney, Agent, or Firm* — Lewis Roca Rothgerber Christie LLP

(57) ABSTRACT

A display device includes: a lower substrate including a display area including a plurality of pixels and peripheral areas around the display area; an encapsulation substrate facing the lower substrate, and including a plurality of edges facing different directions; a sealant between the lower substrate and the encapsulation substrate, the sealant being at the peripheral areas; a voltage transmission line at the peripheral area and being configured to transmit a common voltage; and a voltage transmission electrode at the peripheral area and connected to the voltage transmission line to form at least one contact part, in which the sealant includes a first expanded part and a first non-expanded part having a smaller width than a width of the first expanded part, and the contact part and the first expanded part are alternately arranged.

20 Claims, 9 Drawing Sheets

DISPLAY DEVICE

CROSS-REFERENCE TO RELATED APPLICATION

This application claims priority to and the benefit of Korean Patent Application No. 10-2014-0166440 filed in the Korean Intellectual Property Office on Nov. 26, 2014, the entire contents of which are incorporated herein by reference.

BACKGROUND

1. Field

The present invention relates to a display device, and particularly to, a display device including a sealant.

2. Description of the Related Art

A display device, such as a liquid crystal display (LCD), an organic light emitting diode (OLED) display, and an electrophoretic display, includes a field generating electrode and an electro-optical active layer. For example, the OLED display includes an organic emission layer as an electro-optical active layer. The field generating electrode may be connected to a switching element, such as a thin film transistor, to receive a data signal, and the electro-optical active layer converts the data signal into an optical signal to display an image.

The OLED display among the display devices is a self-emission type and does not require a separate light source. Thus, the OLED display is advantageous regarding power consumption and has an excellent response speed, viewing angle, and contrast ratio.

The OLED display may include a plurality of pixels, such as a red pixel, a blue pixel, a green pixel, and a white pixel, and may express full colors by combining the lights emitted by the pixels. Each pixel includes an organic light emitting element and a plurality of thin film transistors for driving the organic light emitting element.

The light emitting element of the OLED display includes a pixel electrode, an opposing electrode and an emission layer positioned between the pixel electrode and the opposing electrode. One electrode between the pixel electrode and the opposing electrode is an anode electrode and the other electrode is a cathode electrode. Electrons injected from the cathode electrode and holes injected from the cathode electrode are combined in the emission layer to form excitons, and the excitons emit light while emitting energy. The opposing electrode may be formed over the plurality of pixels and may transmit a predetermined common voltage.

The display device such as the OLED display, may have a problem in that when impurities, such as moisture or oxygen, flow into the display device from a surrounding environment, a lifespan of the device may be decreased due to oxidation and peeling of the electrode, light emission efficiency may deteriorate, and/or a color of light emission may be changed.

Accordingly, a sealing process is performed in order to prevent impurities such as moisture, from permeating by isolating an internal element from the outside when manufacturing the display device. The sealing process includes a method of generally laminating a layer formed of organic polymer, such as polyester (PET) on a completed lower substrate or forming a cover or a cap with an encapsulation substrate, and sealing the edges of the cover or the lower substrate and the encapsulation substrate with a sealant material for the OLED display. A frit having an excellent moistureproofing property may be used as the sealant, and an organic sealant and an absorbent may also be used.

The above information disclosed in this Background section is only for enhancement of understanding of the background of the invention and therefore it may contain information that does not form the prior art that is already known in this country to a person of ordinary skill in the art.

SUMMARY

The embodiments of the present invention have been made in an effort to improve adhesion reliability of a sealing area without a defect of an electrode in a display device including a sealant to improve strength.

The embodiments of the present invention have also been made in an effort to provide a display device having high strength and a narrow bezel area. An example embodiment of the present invention provides a display device, including a lower substrate including a display area including a plurality of pixels and peripheral areas around the display area, an encapsulation substrate facing the lower substrate, and including a plurality of edges facing different directions, a sealant between the lower substrate and the encapsulation substrate, the sealant being at the peripheral areas, a voltage transmission line at the peripheral areas, and being configured to transmit a common voltage, and a voltage transmission electrode at the peripheral areas, and connected to the voltage transmission line to form at least one contact part, wherein the sealant includes a first expanded part and a first non-expanded part, the first non-expanded part having a smaller width than a width of the first expanded part, and the contact part and the first expanded part are alternately arranged.

The contact part and the first expanded part may be alternately arranged at the peripheral areas adjacent to one edge among the plurality of edges of the encapsulation substrate.

The plurality of edges may include a first edge, a second edge, and a third edge, which are connected with each other, and the contact part and the first expanded part may be alternately arranged at the peripheral areas adjacent to each of the first edge, the second edge, and the third edge.

The voltage transmission electrode may include a second expanded part and a second non-expanded part, the second non-expanded part having a smaller width than a width of the second expanded part, and the second expanded part may be in contact with the voltage transmission line to form the at least one contact part.

The first expanded part may face the second non-expanded part, and the first non-expanded part may face the second expanded part.

The plurality of edges may further include a second edge and a third edge, and a fourth edge connecting the second edge and the third edge, the sealant may include a first extended part at the peripheral areas adjacent to the fourth edge, and the voltage transmission electrode may include a second extended part at the peripheral areas adjacent to the fourth edge.

A first border of the sealant may face and may be spaced from a second border of the voltage transmission electrode.

The first expanded part of the sealant may overlap the voltage transmission line.

The display device may further include a passivation layer between the voltage transmission line and the voltage transmission electrode, and having a contact hole exposing the voltage transmission electrode, a pixel defining layer on the voltage transmission electrode; and an opposing electrode on the pixel defining layer, wherein the opposing electrode may be connected with the voltage transmission electrode through the contact hole.

The pixel defining layer may include peripheral part covering an end part of the voltage transmission electrode.

The first expanded part may be elongated along the one edge at the peripheral areas adjacent to the one edge.

The plurality of edges may include a first edge, a second edge, and a third edge which are connected with each other, the first edge and the third edge may be opposite each other with the display area interposed therebetween, the contact part and the first expanded part may be alternately arranged at the peripheral areas adjacent to the second edge, and the first expanded part may be elongated along each of the first edge and the third edge in the peripheral areas adjacent to each of the first edge and the third edge.

The voltage transmission electrode may include a second expanded part and a second non-expanded part, the second non-expanded part having a smaller width than a width of the second expanded part, and the second expanded part may be in contact with the voltage transmission line to form the at least one contact part.

The first expanded part may face the second non-expanded part, and the first non-expanded part may face the second expanded part.

The plurality of edges may further include a second edge and a third edge, and a fourth edge connecting the second edge and the third edge, the sealant may include a first extended part at the peripheral areas adjacent to the fourth edge, and the voltage transmission electrode may include a second extended part at the peripheral areas adjacent to the fourth edge.

In the peripheral areas adjacent to at least one edge among the plurality of edges of the encapsulation substrate, the first expanded part may be elongated along the at least one edge.

The first non-expanded part may be elongated along the at least one edge.

The plurality of edges may include a first edge, a second edge, and a third edge, which are connected with each other, the first edge and the third edge may be opposite each other with the display area interposed therebetween, the first non-expanded part may be elongated along the second edge at the peripheral areas adjacent to the second edge, and the first expanded part may be elongated along each of the first edge and the second edge at the peripheral areas adjacent to each of the first edge and the third edge.

The voltage transmission electrode may include a second expanded part and a second non-expanded part, the second non-expanded part having a smaller width than a width of the second expanded part, and the second expanded part may be in contact with the voltage transmission line to form the contact part.

The first expanded part may face the second non-expanded part, and the first non-expanded part faces the second expanded part.

According to example embodiments of the present invention, it is possible to provide the display device including a sealant, which is capable of improving strength of the display device by improving adhesion reliability of a sealing area without causing a defect of an electrode, and has a narrow bezel area while having high strength.

DETAILED DESCRIPTION

Figure 1:
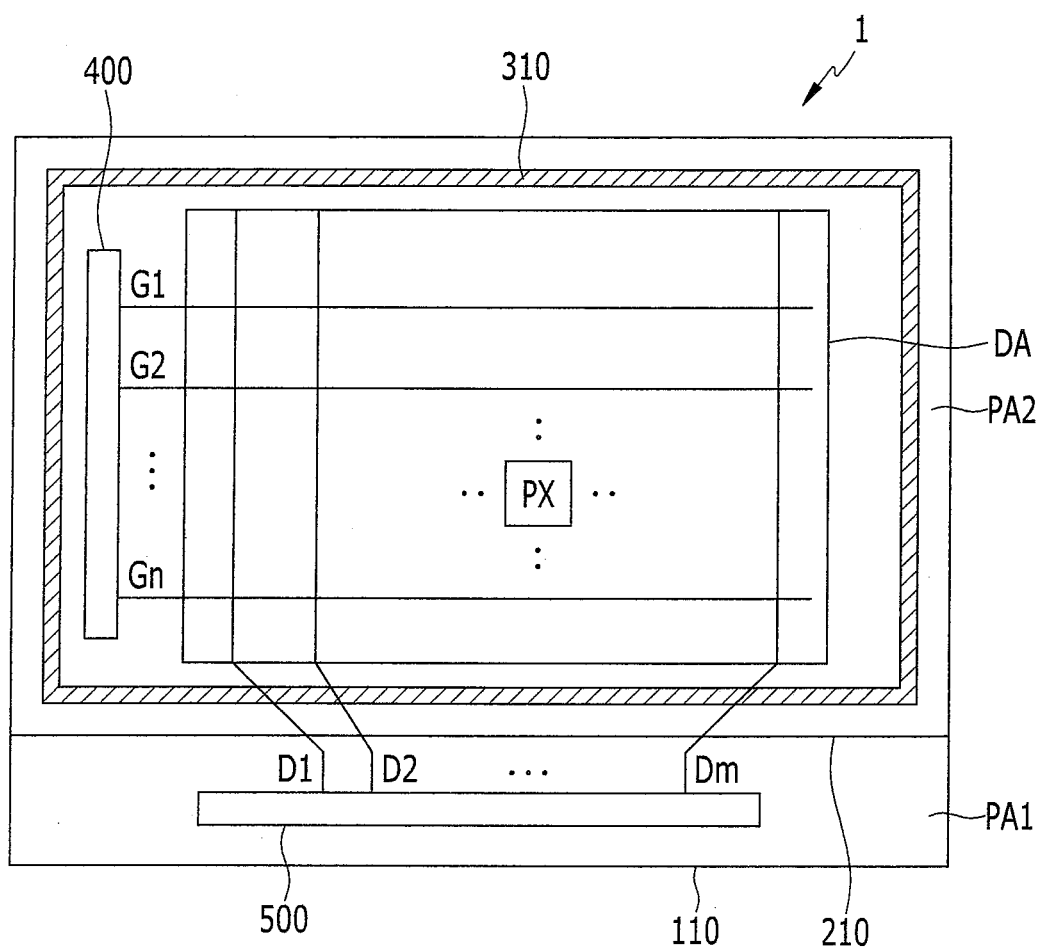
FIG. 1 is a top plan view of a display device according to an example embodiment of the present invention.

Hereinafter, example embodiments will be described in more detail with reference to the accompanying drawings, in which like reference numbers refer to like elements throughout. The present invention, however, may be embodied in various different forms, and should not be construed as being limited to only the illustrated embodiments herein. Rather, these embodiments are provided as examples so that this disclosure will be thorough and complete, and will fully convey the aspects and features of the present invention to those skilled in the art. Accordingly, processes, elements, and techniques that are not necessary to those having ordinary skill in the art for a complete understanding of the aspects and features of the present invention may not be described. Unless otherwise noted, like reference numerals denote like elements throughout the attached drawings and the written description, and thus, descriptions thereof will not be repeated. In the drawings, the relative sizes of elements, layers, and regions may be exaggerated for clarity.

It will be understood that, although the terms "first," "second," "third," etc., may be used herein to describe various elements, components, regions, layers and/or sections, these elements, components, regions, layers and/or sections should not be limited by these terms. These terms are used to distinguish one element, component, region, layer or section from another element, component, region, layer or section. Thus, a first element, component, region, layer or section described below could be termed a second element, component, region, layer or section, without departing from the spirit and scope of the present invention.

Spatially relative terms, such as "beneath," "below," "lower," "under," "above," "upper," and the like, may be used herein for ease of explanation to describe one element or feature's relationship to another element(s) or feature(s) as illustrated in the figures. It will be understood that the spatially relative terms are intended to encompass different orientations of the device in use or in operation, in addition to the orientation depicted in the figures. For example, if the device in the figures is turned over, elements described as "below" or "beneath" or "under" other elements or features would then be oriented "above" the other elements or features. Thus, the example terms "below" and "under" can encompass both an orientation of above and below. The device may be otherwise oriented (e.g., rotated 90 degrees or at other orientations) and the spatially relative descriptors used herein should be interpreted accordingly.

It will be understood that when an element or layer is referred to as being "on," "connected to," or "coupled to" another element or layer, it can be directly on, connected to, or coupled to the other element or layer, or one or more intervening elements or layers may be present. In addition, it will also be understood that when an element or layer is referred to as being "between" two elements or layers, it can be the only element or layer between the two elements or layers, or one or more intervening elements or layers may also be present.

The terminology used herein is for the purpose of describing particular embodiments only and is not intended to be limiting of the present invention. As used herein, the singular forms "a" and "an" are intended to include the plural forms as well, unless the context clearly indicates otherwise. It will be further understood that the terms "comprises," "comprising," "includes," and "including," when used in this specification, specify the presence of the stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list.

As used herein, the term "substantially," "about," and similar terms are used as terms of approximation and not as terms of degree, and are intended to account for the inherent deviations in measured or calculated values that would be recognized by those of ordinary skill in the art. Further, the use of "may" when describing embodiments of the present invention refers to "one or more embodiments of the present invention." As used herein, the terms "use," "using," and "used" may be considered synonymous with the terms "utilize," "utilizing," and "utilized," respectively. Also, the term "exemplary" is intended to refer to an example or illustration.

The electronic or electric devices and components and/or any other relevant devices or components, such as, for example, a scan driver and a data driver, according to embodiments of the present invention described herein may be implemented utilizing any suitable hardware, firmware (e.g. an application-specific integrated circuit), software, or a combination of software, firmware, and hardware. For example, the various components of these devices may be formed on one integrated circuit (IC) chip or on separate IC chips. Further, the various components of these devices may be implemented on a flexible printed circuit film, a tape carrier package (TCP), a printed circuit board (PCB), or the like. Further, the various components of these devices may be a process or thread, running on one or more processors, in one or more computing devices, executing computer program instructions and interacting with other system components for performing the various functionalities described herein. The computer program instructions may be stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the spirit and scope of the present invention.

Unless otherwise defined, all terms (including technical and scientific terms) used herein have the same meaning as commonly understood by one of ordinary skill in the art to which the present invention belongs. It will be further understood that terms, such as those defined in commonly used dictionaries, should be interpreted as having a meaning that is consistent with their meaning in the context of the relevant art and/or the present specification, and should not be interpreted in an idealized or overly formal sense, unless expressly so defined herein.

A display device according to an example embodiment of the present invention will be described with reference to FIGS. 1 to 7.

Figure 2:
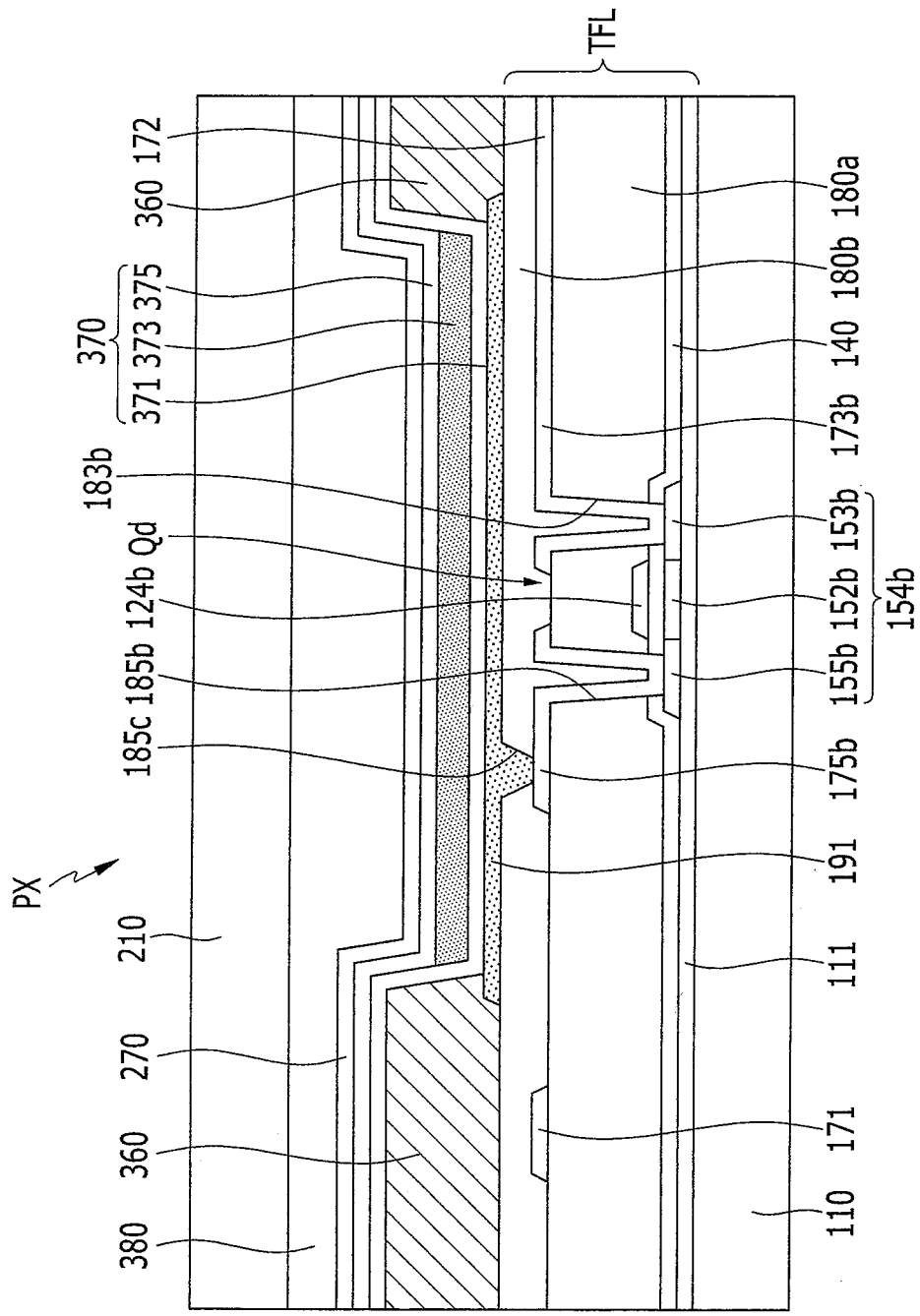
FIG. 2 is a cross-sectional view of one pixel of the display device according to an example embodiment of the present invention.
Figure 3:
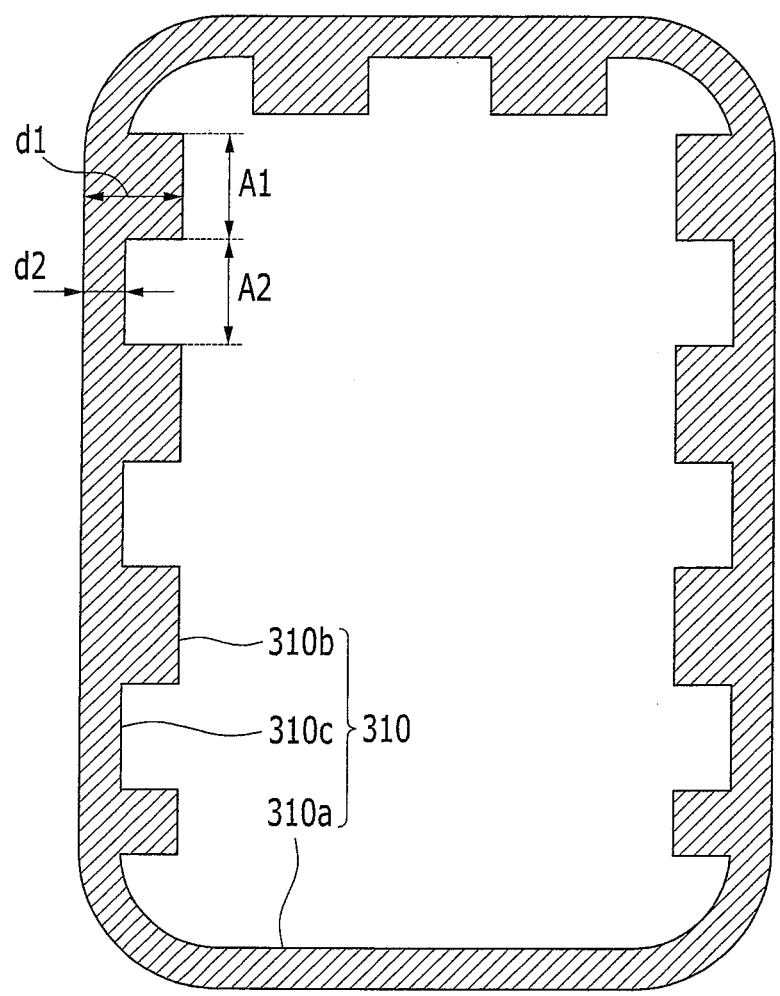
FIG. 3 is a top plan view illustrating a sealant of the display device according to an example embodiment of the present invention.
Figure 4:
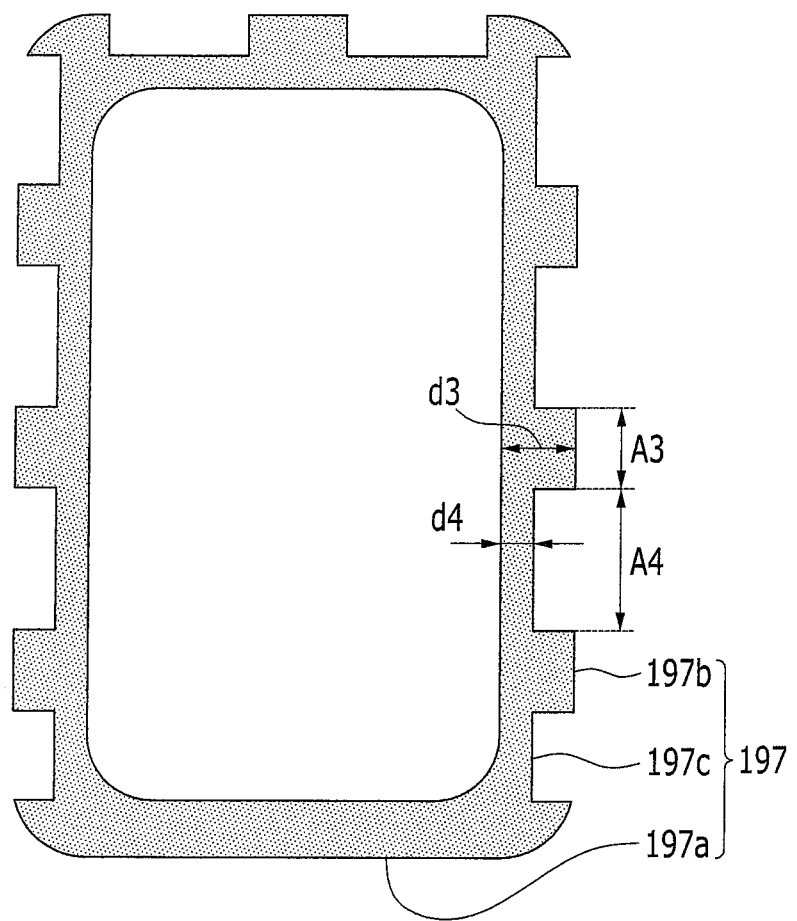
FIG. 4 is a top plan view illustrating a voltage transmission line of the display device according to an example embodiment of the present invention.
Figure 5:
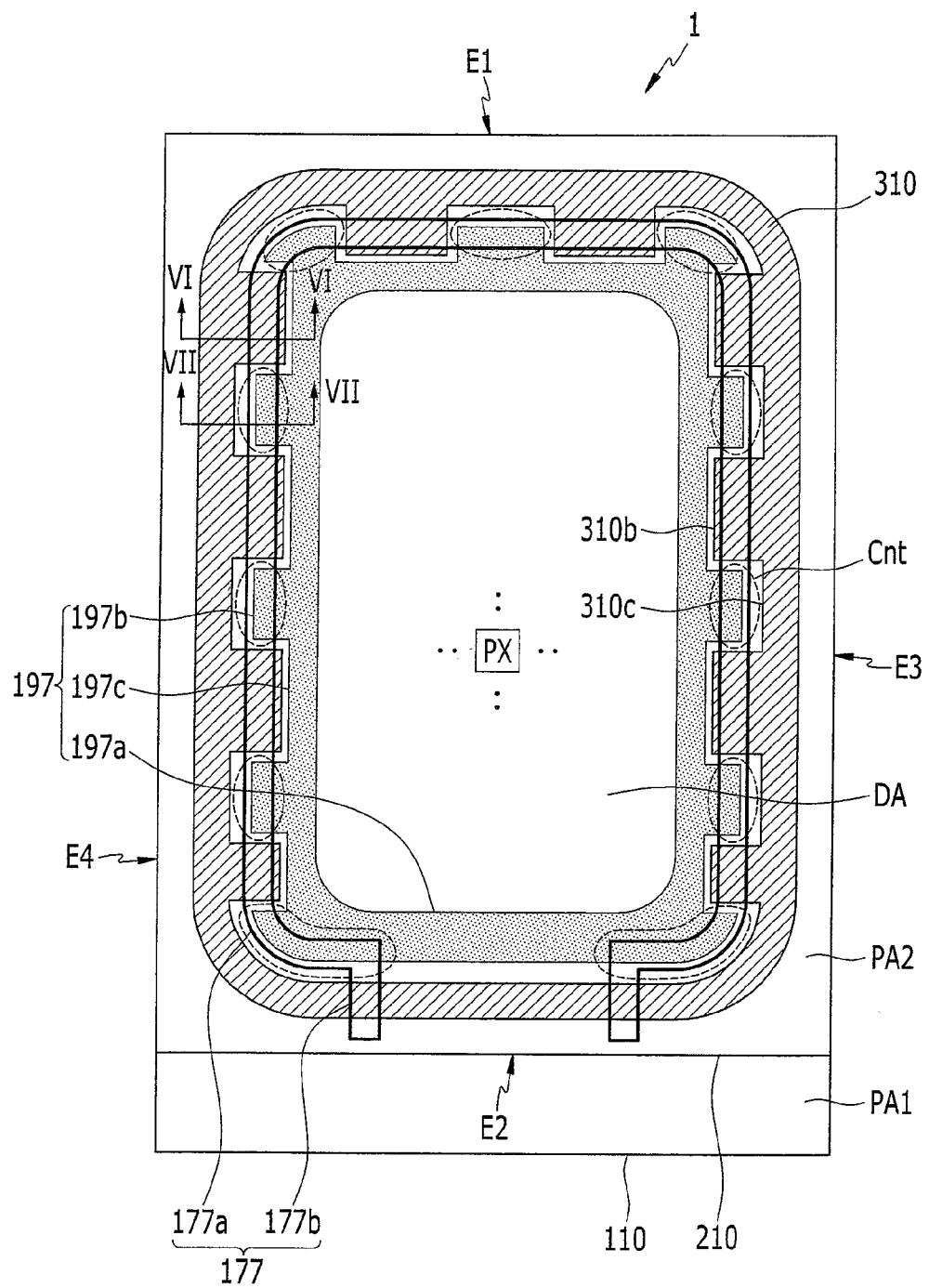
FIG. 5 is a top plan view of the display device according to an example embodiment of the present invention.
Figure 6:
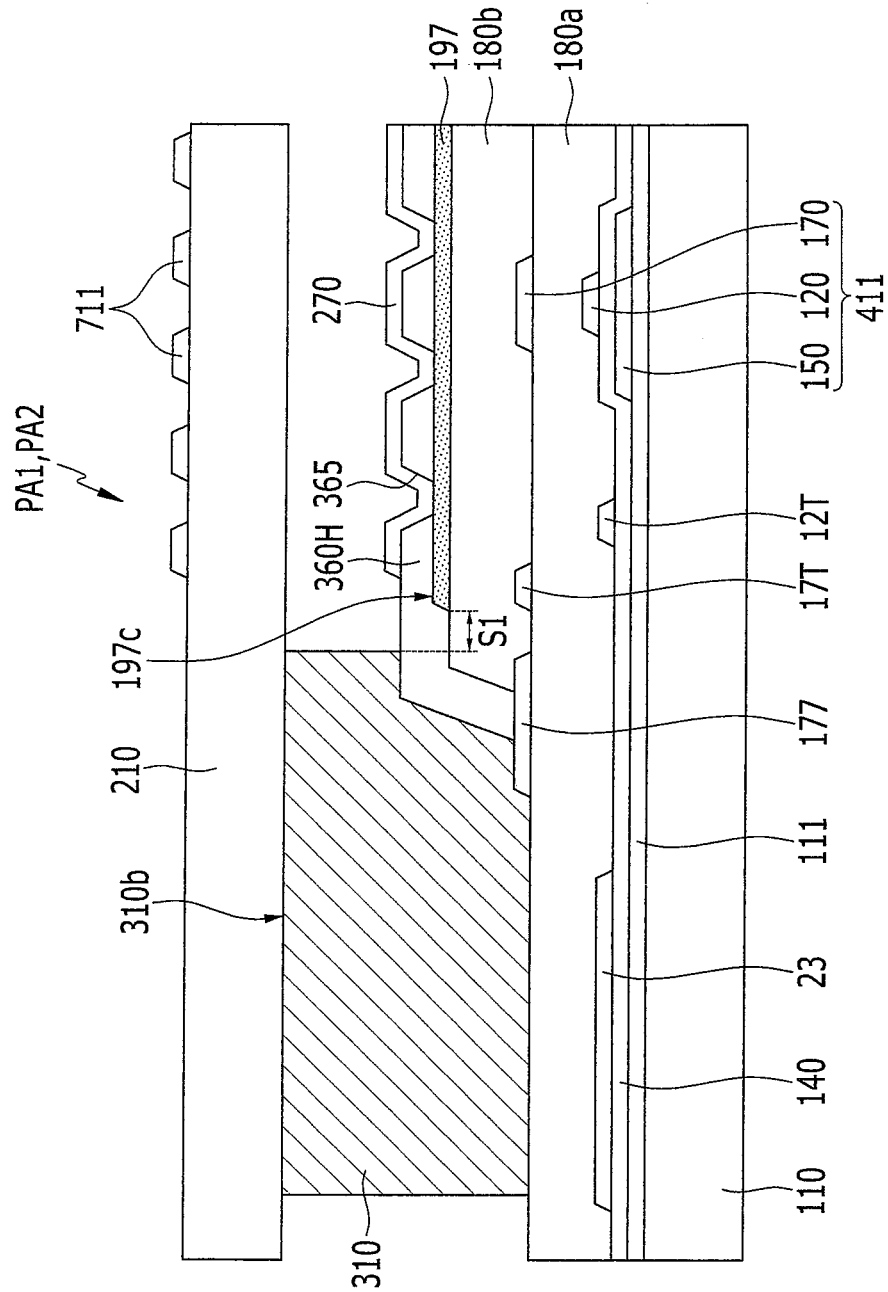
FIG. 6 is a cross-sectional view of the display device of FIG. 5 taken along the line VI-VI.
Figure 7:
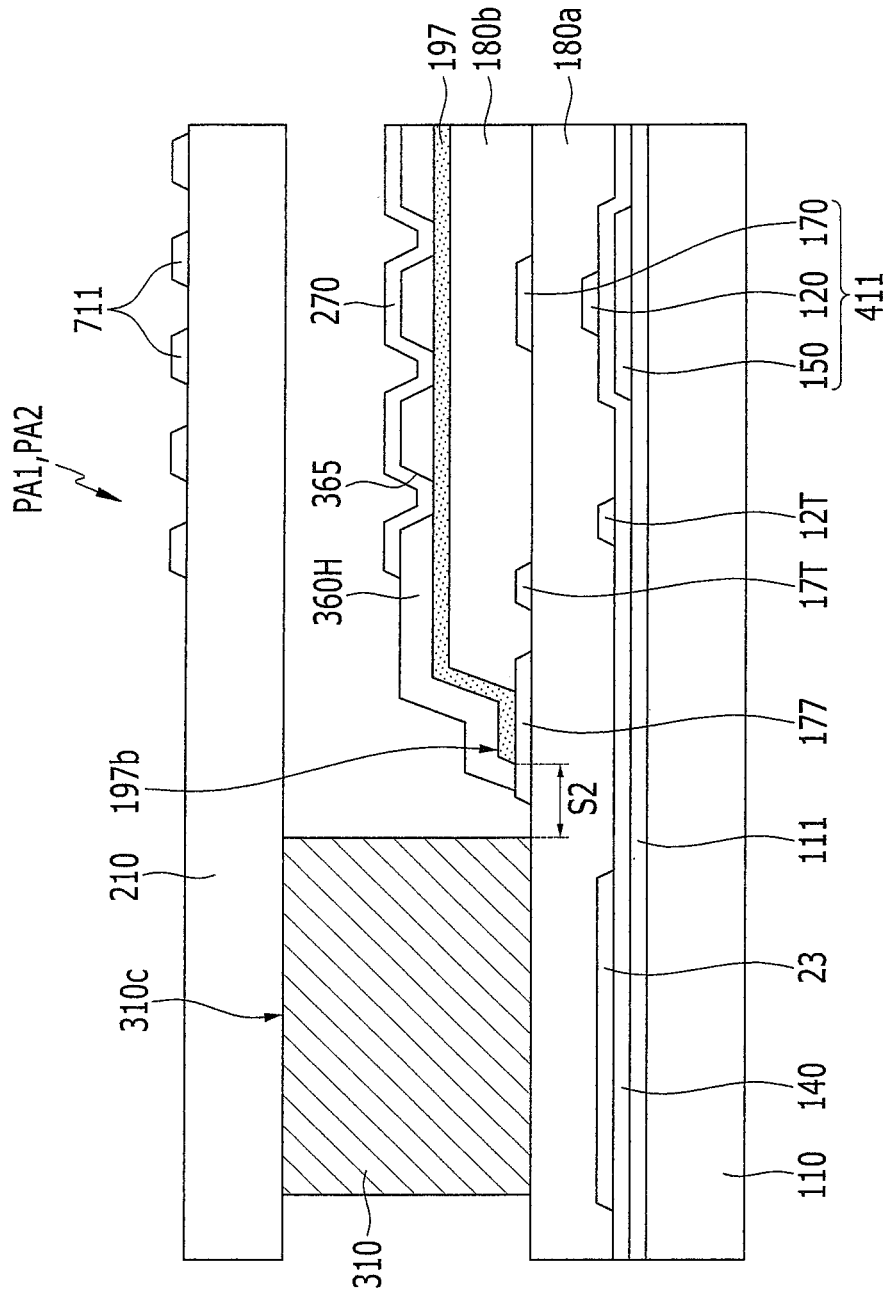
FIG. 7 is a cross-sectional view of the display device of FIG. 5 taken along the line VII-VII.

FIG. 1 is a schematic view of a display device according to an example embodiment of the present invention, FIG. 2 is a cross-sectional view of one pixel of the display device according to an example embodiment of the present invention, FIG. 3 is a top plan view illustrating a sealant of the display device according to an example embodiment of the present invention, FIG. 4 is a top plan view illustrating a voltage transmission line of the display device according to an example embodiment of the present invention, FIG. 5 is a top plan view of the display device according to the example embodiment of the present invention, FIG. 6 is a cross-sectional view of the display device of FIG. 5 taken along the line VI-VI, and FIG. 7 is a cross-sectional view of the display device of FIG. 5 taken along the line VII-VII.

First, referring to FIG. 1, a display device 1 according to an example embodiment of the present invention includes a display area DA, which is an area for displaying an image, and peripheral areas PA1 and PA2 around the display area DA, according to a top plan structure. The peripheral areas PA1 and PA2 may refer to the remaining areas except for the display area DA of the display device 1. As can be seen in FIG. 1, a scan driver 400 is at the peripheral area PA2 and a data driver 500 is at the peripheral area PA1. Referring to FIG. 2, the display device 1 according to the example embodiment of the present invention includes a lower substrate 110 and an encapsulation substrate 210, which face each other, according to a cross-sectional structure.

The lower substrate 110 includes the display area DA and the peripheral area PA1 around the display area DA, and the encapsulation substrate 210 includes the display area DA and the peripheral area PA2 around the display area DA.

The display area DA includes a plurality of signal lines and a plurality of pixels PX connected to the plurality of signal lines. The plurality of pixels PX may be arranged approximately in a matrix form, but is not limited thereto.

The signal lines may be provided on the lower substrate 110, and may include a plurality of gate lines G1 to Gn for transmitting a gate signal and a plurality of data lines D1 to Dm for transmitting a data voltage. The gate lines G1 to Gn may be extended approximately in a row direction and generally (e.g., substantially) parallel to each other, and the data lines D1 to Dm may be extended approximately in a column direction and generally (e.g., substantially) parallel to each other.

Referring to FIGS. 1 and 2, each pixel PX may include one or more switching elements Qd connected to one or more gate lines G1 to Gn and one or more data lines D1 to Dm, 171, one or more pixel electrodes 191 connected with the switching elements Qd, and an opposing electrode 270 forming an electro-optical active layer of a light emitting element and the like, together with the pixel electrode 191. For an OLED display, an emission layer 373 may be positioned between the pixel electrode 191 and the opposing electrode 270 to form a light emitting element. The switching element Qd may include one or more thin film transistors. The opposing electrode 270 may transmit a common voltage ELVSS.

In order to implement a color display, each pixel PX may display one of the primary colors, and a desired color is realized by a combination of the primary colors. Examples of the primary color may include three primary colors, such as red, green, and blue, or in some examples, the primary color may include four primary colors. Each pixel may further include a color filter positioned at a place corresponding to each pixel electrode to express one of the primary colors, and the emission layer 373 may also be a colored emission layer.

A particular cross-sectional structure of the display device according to the example embodiment of the present invention will be described with reference to FIGS. 1 to 7.

A buffer layer 111 may be positioned on the lower substrate 110, which may be formed of a transparent glass or a transparent plastic. The buffer layer 111 may prevent impurities from permeating and a surface of the buffer layer 111 may be flat. In some embodiments, the buffer layer 111 may include silicon nitride (SiNx), silicon oxide (SiO$_2$), and silicon oxynitride (SiOxNy). In some embodiments, the buffer layer 111 may be omitted.

In some embodiments, at least one semiconductor layer is positioned on the buffer layer 111.

The semiconductor layer includes a first semiconductor 154b positioned in the display area DA. The first semiconductor 154b may include a channel area 152b, and a source area 153b and a drain area 155b positioned at respective sides of the channel area 152b, which are formed by being doped.

The semiconductor layer may further include at least one second semiconductor 150 positioned in the peripheral area PA1 of the lower substrate 110.

The semiconductor layer may include amorphous silicon, polycrystal silicon, and/or an oxide semiconductor.

A gate insulating layer 140, which may be formed of silicon nitride (SiNx) or silicon oxide (SiO$_2$), may be positioned on the semiconductor layer.

A plurality of gate conductors may be positioned on the gate insulating layer 140.

The gate conductor includes a first control electrode 124b positioned in the display area DA. In some embodiments, the first control electrode 124b may overlap a part of the first semiconductor 154b such as the channel area.

The gate conductor may further include at least one second control electrode 120 positioned in the peripheral areas PA1 and PA2. The second control electrode 120 may include a part overlapping the second semiconductor 150.

In some embodiments, the gate conductor may further include a test signal line 12T positioned in the peripheral areas PA1 and PA2. The test signal line 12T may be positioned closer to an edge of the display device than the second control electrode 120, but is not limited thereto. In some embodiments, the gate conductor may further include a heat transfer layer 23 positioned in the peripheral areas PA1 and PA2.

A first passivation layer 180a is positioned on the gate insulating layer 140 and the gate conductor. The first passivation layer 180a and the gate insulating layer 140 may include a contact hole 183b for exposing the source area 153b of the first semiconductor 154b, and a contact hole 185b for exposing the drain area 155b of the first semiconductor 154b in the display area DA.

A plurality of data conductors is positioned on the first passivation layer 180a.

The data conductor may include a plurality of data lines 171, a driving voltage line, and a plurality of first output electrodes 175b. The driving voltage line may include a plurality of first input electrodes 173b which transmits a driving voltage ELVDD and is extended toward the first control electrode 124b. The first output electrode 175b faces the first input electrode 173b on the first semiconductor 154b. The first input electrode 173b and the first output electrode 175b may be connected with the source area 153b and the drain area 155b of the first semiconductor 154b through the contact holes 183b and 185b, respectively.

The data conductor may further include a voltage transmission line 177 positioned in the peripheral areas PA1 and PA2. The voltage transmission line 177 may transmit a common voltage ELVSS.

The data conductor may further include at least one second input/output electrode 170 positioned in the peripheral areas PA1 and PA2. In some embodiments, the data conductor may further include a test signal line 17T positioned in the peripheral areas PA1 and PA2. The test signal line 17T may be positioned closer to the edge of the display device than the second input/output electrode 170, but is not limited thereto.

The first control electrode 124b, the first input electrode 173b, and the first output electrode 175b form the switching element Qd which is a transistor together with the first semiconductor 154b. A structure of the switching element Qd is not limited to the illustration, and may be varied.

In some embodiments, the second control electrode, the second input/output electrode 170, and the second semiconductor 150 may form at least one transistor 411.

A second passivation layer 180b including an inorganic insulating material or an organic insulating material may be positioned on the data conductor. The second passivation layer 180b may have a substantially flat surface in order to improve light emission efficiency of an organic light emitting element which is formed on the second passivation layer 180b. The second passivation layer 180b may have a contact hole 185c for exposing the first output electrode 175b.

The second passivation layer 180b may expose at least a part of the voltage transmission line 177 in the peripheral area PA1. Referring to FIGS. 6 and 7, the second passivation layer 180b may include a border positioned on the voltage transmission line 177 in the peripheral area PA1.

A pixel electrode layer may be positioned on the second passivation layer 180b.

The pixel electrode layer includes a pixel electrode 191 positioned in the pixel PX.

Each pixel electrode 191 may be physically and electrically connected with the first output electrode 175b through the contact hole 185c of the second passivation layer 180b.

The pixel electrode layer may further include a voltage transmission electrode 197 in the peripheral areas PA1 and PA2. At least a part of the voltage transmission electrode 197 may be physically and electrically connected with the voltage transmission line 177 to transmit a common voltage ELVSS. A particular plane shape of the voltage transmission electrode 197, according to an embodiment, will be described below.

The pixel electrode layer may include a semi-transmissive conductive material or a reflective conductive material.

Referring to FIG. 2, the layers on the lower substrate 110, for example, the layers from the buffer layer 111 to the second passivation layer 180b, are referred to as a transistor layer TFL.

In some embodiments, a pixel defining layer (also referred to as a partition wall) 360 is positioned on the second passivation layer 180b and the pixel electrode layer. The pixel defining layer 360 has a plurality of openings which exposes the pixel electrode 191 to define each pixel area.

Referring to FIGS. 6 and 7, the pixel defining layer 360 may include a peripheral part 360H for covering the voltage transmission electrode 197 in the peripheral areas PA1 and PA2. A height of the peripheral part 360H may be smaller than a height of the pixel defining layer 360 of the display area DA. The peripheral part 360H of the pixel defining layer 360 may cover an end part of the voltage transmission electrode 197.

The peripheral part 360H includes one or more contact holes 365 positioned in the peripheral areas PA1 and PA2.

An emission member 370 is positioned on the pixel defining layer 360 and the pixel electrode 191. The emission member 370 may include a first organic common layer 371, a plurality of emission layers 373, and a second organic common layer 375, which are sequentially stacked.

The first organic common layer 371 may include at least one of, for example, a hole injection layer and a hole transport layer which are sequentially stacked. In some embodiments, the first organic common layer 371 may be formed over the entire display area DA, in which the pixels PX are arranged, and may also be formed only in each pixel area PX.

The emission layer 373 may be positioned on the pixel electrode 191 of each corresponding pixel PX. The emission layer 373 may be formed of an organic material uniquely emitting light of the primary colors, such as red, green, and blue, and may have a structure in which a plurality of organic material layers emitting light of different colors is stacked. For example, a red organic emission layer may be stacked on the first organic common layer 371 of the pixel PX displaying red light, a green organic emission layer may be stacked on the first organic common layer 371 of the pixel PX displaying green light, and a blue organic emission layer may be stacked on the first organic common layer 371 of the pixel PX displaying blue light. However, the organic emission layer is not limited thereto, and the organic emission layer displaying one primary color may be stacked in a pixel PX displaying a different color. According to another example embodiment of the present invention, the emission layer 373 may include a white emission layer displaying white light.

The second organic common layer 375 may include at least one of, for example, an electron transport layer and an electron injecting layer which are sequentially stacked.

In some embodiments, at least one of the first organic common layer 371 and the second organic common layer 375 may be omitted.

The opposing electrode 270 for transmitting the common voltage ELVSS is positioned on the emission member 370. The opposing electrode 270 is mostly positioned in the display area DA, and extended to the peripheral areas PA1 and PA2 and physically and electrically connected with the voltage transmission electrode 197 through the contact hole 365 of the peripheral part 360H of the pixel defining layer 360 as illustrated in FIGS. 6 and 7 to receive the common voltage ELVSS.

The opposing electrode 270 may include a transparent conductive material. For example, when the opposing electrode 270 includes metal, such as calcium (Ca), barium (Ba), magnesium (Mg), aluminum (Al), and silver (Ag), a metal layer may be formed to be thin enough to transmit light.

The pixel electrode 191, the emission member 370, and the opposing electrode 270 of each pixel PX form the light emitting element, and one of the pixel electrode 191 and the opposing electrode 270 is the cathode and the other is the anode.

A passivation layer 380 for protecting the opposing electrode 270 may be further positioned on the opposing electrode 270. The passivation layer 380 may include an organic insulating material.

The encapsulation substrate 210 facing the lower substrate 110 is positioned on the passivation layer 380.

The encapsulation substrate 210 may encapsulate the emission member 370 and the opposing electrode 270 to prevent moisture and/or oxygen from permeating from the outside.

Referring to FIG. 1, the encapsulation substrate 210 may expose a part of the peripheral area PA1 of the lower substrate 110, and the exposed part is referred to as a pad part. A driver 500 for driving the light emitting element may be mounted at the pad part in the form of at least one integrated circuit chip. By contrast, the driver 500 may be mounted on a flexible printed circuit film (FPC) or printed circuit board and attached to the pad part in the form of a tape carrier package (TCP) or integrated on the lower substrate 110. The signal lines, such as the data lines D1 to Dm, of the display area DA may be extended, so that end parts of the signal lines may be positioned in the pad part. In this case, the driver 500 may be a data driver connected to end parts of the data lines D1 to Dm to transmit a data signal to the data lines D1 to Dm.

The aforementioned voltage transmission line 177 may receive the common voltage ELVSS through the pad part.

Another driver 400 for driving the light emitting element may be positioned in the peripheral area PA1 of the lower substrate 110 covered by the encapsulation substrate 210. The driver 400 may be mounted in the form of at least one integrated circuit chip on the lower substrate 110 or mounted on a flexible FPC or printed circuit board to be attached onto the lower substrate 110 in the form of the TCP or be integrated on the lower substrate 110. The driver 400 may be a gate driver connected with the gate lines G1 to Gn to transmit a gate signal to the gate lines G1 to Gn.

When the driver 400 is integrated on the lower substrate 110, the driver 400 may include at least one transistor 411 formed in the peripheral area PA1.

A plurality of touch wires 711, which is connected with a touch sensor and capable of transmitting a signal, may be formed on the encapsulation substrate 210.

A sealant 310 is positioned between the lower substrate 110 and the encapsulation substrate 210. The sealant 310 may be positioned in the peripheral area PA1 of the lower substrate 110 and the peripheral area PA2 of the encapsulation substrate 210, and forms a looped curve while surrounding the display area DA. The sealant 310 combines the lower substrate 110 and the encapsulation substrate 210 to affix the lower substrate 110 and the encapsulation substrate 210, and prevents external impurities, such as moisture and oxygen, from permeating between the lower substrate 110 and the encapsulation substrate 210 to seal the electro-optical active layer, such as the light emitting element.

The sealant 310 may include a frit having an excellent moistureproofing property, an organic sealant, and an absorbent. Particularly, the sealant 310 may include a sealing material positioned between the lower substrate 110 and the encapsulation substrate 210, and then the lower substrate 110 and the encapsulation substrate 210 may be fused when heat is applied to the sealing material. In this case, heat may be applied to the sealant 310 by using an infrared lamp or laser. In some embodiments, the sealant may include a light absorbent capable of absorbing laser or infrared rays. Particularly, the frit may be used by inserting oxide powder into glass powder, or including an organic material in order to make the frit into a paste. When the frit is melted by applying heat to the frit applied between the lower substrate 110 and the encapsulation substrate 210, the lower substrate 110 and the encapsulation substrate 210 may be bonded to each other through the sintered frit, and the internal elements of the display device may be completely sealed.

The sealant 310 may overlap the heat transmission layer 23 on the lower substrate 110 to easily receive heat through the heat transmission layer 23 during the manufacturing process.

Referring to FIG. 5, a border edge of the encapsulation substrate 210 included in the display device 1 according to the example embodiment of the present invention may be divided into an upper edge E1 forming an upper side, a lower edge E2 forming a lower side, a right edge E3 forming a right side, and a left side E4 forming a left side, as oriented according to the plane view. Four edges E1 to E4 may form a quadrangle as illustrated in FIG. 5, but are not limited thereto, and may form an ellipse, a circle, and the like.

Referring to FIGS. 3 and 5, the sealant 310 of the display device according to example embodiments of the present invention is formed along four edges E1 to E4 of the encapsulation substrate 210 in the peripheral area PA2.

The sealant 310 includes at least one expanded part 310b and at least one non-expanded part 310c. In some embodiments, the expanded part 310b and the non-expanded part 310c may be alternately arranged. A width d1 of the expanded part 310b is larger than a width d2 of the non-expanded part 310c.

The expanded part 310b of the sealant 310 may overlap the voltage transmission line 177, and the non-expanded part 310c may not overlap the voltage transmission line 177.

In some embodiments, at least one expanded part 310b and at least one non-expanded part 310c may be alternately arranged along at least one edge E1 to E4 among the four edges E1 to E4 of the encapsulation substrate 210. In some embodiments, an internal border of the sealant 310 may be provided with embossings or have a quadrangular sawtooth shape.

FIGS. 3 and 5 illustrate an example of the case where each of the parts formed along the upper edge E1, the right edge E3, and the left edge E4 of the sealant 310 includes at least one expanded part 310b and at least one non-expanded part 310c. When a length of the upper edge E1 is smaller than a length of the right edge E3 or the left edge E4, the number of expanded parts 310b and non-expanded part 310c formed along the upper edge E1 may be smaller than the number of expanded parts 310b and non-expanded part 310c formed along the right edge E3 or the left edge E4.

For the expanded parts 310b and the non-expanded part 310c alternately arranged along one edge among the edges E1 to E4 of the encapsulation substrate 210, a length A1 of the expanded part 310b may be larger than a length A2 of the non-expanded part 310c. Here, the directions of the lengths A1 and A2 may be substantially perpendicular to the directions of the widths d1 and d2.

A part which does not include the alternately arranged expanded part 310b and non-expanded part 310c in the sealant 310 may generally include an extended part 310a having a predetermined width.

Referring to FIGS. 3 and 5, the sealant 310 positioned around the lower edge E2 positioned at a side at which the pad part is positioned may include the extended part 310a. A width of the extended part 310a may generally be the same width as the width d2 of the non-expanded part 310c, but is not limited thereto. That is, the width of the extended part 310a may be larger or smaller than the width d2 of the non-expanded part 310c, and be larger than the width d1 of the expanded part 310b.

The voltage transmission line 177 includes a main transmission part 177a and an end part 177b connected to the main transmission part 177a. The main transmission part 177a may be formed around the display area DA and extend along the upper edge E1, the right edge E3, and the left edge E4 of the encapsulation substrate 210. The end part 177b may be positioned at or close to the lower edge E2 and extended to the pad part of the lower substrate 110. The end part 177b may include two parts which are positioned at respective ends of the main transmission part 177a, and spaced apart from each other along the lower edge E2, but is not limited thereto. A width of the voltage transmission line 177 may be uniform, but is not limited thereto.

The voltage transmission electrode 197 may be positioned in the peripheral areas PA1 and PA2, and formed along the display area DA. The voltage transmission electrode 197 according to the example embodiment of the present invention may form a loop surrounding the display area DA.

The voltage transmission electrode 197 includes at least one expanded part 197b and at least one non-expanded part 197c. The expanded part 197b and the non-expanded part 197c may be alternately arranged. A width d3 of the expanded part 197b is larger than a width d4 of the non-expanded part 197c.

The expanded part 197b of the voltage transmission electrode 197 is expanded toward the voltage transmission line 177 so that a part thereof is in contact with the voltage transmission line 177 to be electrically and physically connected with the voltage transmission line 177. The part of the expanded part 197b that makes contact with the voltage transmission line 177 is referred to as a contact part Cnt. In FIG. 5, the contact part Cnt is indicated by a dotted line ellipse. The non-expanded part 197c of the voltage transmission electrode 197 does not overlap the voltage transmission line 177.

At least one expanded part 197b and at least one non-expanded part 197c may be alternately arranged along at least one edge E1 to E4 of the four edges E1 to E4 of the encapsulation substrate 210. In this part, an outer border of the voltage transmission electrode 197 may be provided with embossings or have a quadrangular sawtooth shape.

FIGS. 4 and 5 illustrate an example in which each of the parts formed along the upper edge E1, the right edge E3, and the left edge E4 in the voltage transmission electrode 197 includes at least one expanded part 197b and at least one non-expanded part 197c. When a length of the upper edge E1 is smaller than a length of the upper edge E3 or the left edge E4, the number of expanded parts 197b and non-expanded parts 197c formed along the upper edge E1 may be smaller than the number of expanded parts 197b and non-expanded parts 197c formed along the right edge E3 or the left edge E4.

In the expanded parts 197b and the non-expanded parts 197c alternately arranged along one edge among the edges E1 to E4 of the encapsulation substrate 210, a length A3 of the expanded part 197b may be smaller than a length A4 of the non-expanded part 197c.

The expanded part 197b of the voltage transmission electrode 197 faces the non-expanded part 310c of the sealant 310, and the non-expanded part 197c of the voltage transmission electrode 197 faces the expanded part 310b of the sealant 310.

A part of the voltage transmission electrode 197 which does not have the alternately arranged expanded part 197b and non-expanded part 197c may generally have an extended part 197a having a predetermined width.

Referring to FIGS. 4 and 5, the voltage transmission electrode 197 positioned around the lower edge E2 at the side at which the pad part is positioned may include the extended part 197a. A width of the extended part 197a may be generally the same as the width d3 of the expanded part 197b, but is not limited thereto. That is, the width of the extended part 197a may be greater than or less than the width d3 of the expanded part 197b, and may be less than the width d4 of the non-expanded part 197c.

The extended part 197a of the voltage transmission electrode 197 faces the extended part 310a of the sealant 310 and extends in parallel to the extended part 310a of the sealant 310.

At least a part of the extended part 197a may form the contact part Cnt, which is in contact with, and electrically and physically connected with the voltage transmission line 177. According to the example embodiment illustrated in FIGS. 3 to 5, the extended part 197a may be connected with the voltage transmission line 177 around the lower edge E2 of the encapsulation substrate 210. A pair of contact parts Cnt of the extended part 197a and the voltage transmission line 177 may be positioned at areas around a pair of end parts 177b of the voltage transmission line 177 around the lower edge E2 of the encapsulation substrate 210.

Referring to FIGS. 3 to 7, the voltage transmission electrode 197 is positioned between the sealant 310 and the display area DA, and does not overlap the sealant 310. That is, the voltage transmission electrode 197 is positioned at an inner side of the internal border of the sealant 310 and is spaced apart from the inner side of the internal border of the sealant 310. When the sealant 310 overlaps the voltage transmission electrode 197, the voltage transmission electrode 197 may be easily broken due to pressure by the sealant 310, and the display area DA may result in a defect by a short circuit between the broken voltage transmission electrode 197 and another electrode. However, according to the present example embodiment, the sealant 310 and the voltage transmission electrode 197 do not overlap and are spaced apart from each other so that the voltage transmission electrode 197 is not broken and various defects according to the broken voltage transmission electrode 197 are not generated.

According to an embodiment, the spaced distance between the sealant 310 and the voltage transmission electrode 197, which face each other, may generally be uniform, but is not limited thereto, and may be varied depending on the part. For example, the spaced distance between the sealant 310 and the voltage transmission electrode 197 may be varied according to positions of the edges E1 to E4 of the encapsulation substrate 210, at which sealant 310 and the voltage transmission electrode 197 are closely positioned. For example, referring to FIGS. 5 and 6, a spaced distance S1 between the non-expanded part 197c of the voltage transmission electrode 197 and the expanded part 310b of the sealant 310 may be smaller than a spaced distance S2 between the expanded part 197b of the voltage transmission electrode 197 and the non-expanded part 310c of the sealant 310, but is not limited thereto. That is, the spaced distance S1 may be greater than or equal to the spaced distance S2.

According to an example embodiment of the present invention, the inner border of the sealant 310 may be substantially extended in parallel to the outer border of the voltage transmission electrode 197 and arranged while being engaged with the outer border of the voltage transmission electrode 197 at parts at which the expanded part 310b and the non-expanded part 310c of the sealant 310 are alternately arranged, and the expanded part 197b and the non-expanded part 197c of the voltage transmission electrode 197 are alternately arranged along any one edge of the edges E1 to E4 of the encapsulation substrate 210. That is, the embossing at the inner border of the sealant 310 and the embossing of the outer border of the voltage transmission electrode 197 facing the embossing at the inner border of the sealant 310 may be formed while being engaged with each other.

When the length A1 of the expanded part 310b is larger than the length A2 of the non-expanded part 310c in the aforementioned sealant 310, the length A3 of the expanded part 197b may be smaller than the length A4 of the non-expanded part 197c in the voltage transmission electrode 197.

In some embodiments, when the width of the extended part 310a of the sealant 310 is larger than the width of the voltage transmission electrode 197, the width of the extended part 197a of the voltage transmission electrode 197 facing the extended part 310a of the sealant 310 may be small.

According to the example embodiment of the present invention, at the side at which the pad part of the lower substrate 110 is not positioned, that is, the peripheral areas PA1 and PA2 around the upper edge E1, the right edge E3, and the left edge E4 among the edges E1 to E4 of the encapsulation substrate 210, one or more contact parts Cnt of the voltage transmission line 177 and the voltage transmission electrode 197 may exist, but the contact parts Cnt may not be continuously formed. Instead, the contact parts Cnt may be intermittently formed. The expanded part 310b of the sealant 310 is positioned at a part at which the contact part Cnt does not exist in the area so that it may be possible to increase an entire area of the sealant 310. Accordingly, it is possible to improve the strength of the display device 1 by enhancing the adhesive force of the lower substrate 110 and the encapsulation substrate 210. In order to further improve the strength of the display device 1, the expanded part 310b of the sealant 310 may not be arranged only around any one edge E1 to E3 of the encapsulation substrate 210, but instead, may be arranged at least two edges of the edges E1 to E4, and the plurality of expanded parts 310b may be arranged at one edge of the edges E1 to E4. The expanded part 310b of the sealant 310 may not exist around the edge E2 at which the pad part is positioned.

The contact part Cnt may be alternately arranged with the expanded part 310b of the sealant 310 according to a plane (e.g., on a plane). In some embodiments, when the plurality of spaced contact parts Cnt exists in the peripheral areas PA1 and PA2 around the upper edge E1, the right edge E3, and the left edge E4 among the edges E1 to E4 of the encapsulation substrate 210, the contact part Cnt and the expanded part 310b of the sealant 310 may be alternately arranged. In some embodiments, the plurality of contact parts Cnt may be positioned around one edge E1, E3, or E4.

In some embodiments, the expanded part 310b of the sealant 310 faces the non-expanded part 197c of the voltage transmission electrode 197 and does not overlap the voltage transmission electrode 197 so that it is possible to prevent a defect from being generated in the voltage transmission electrode 197 as described above.

As described above, according to example embodiments of the present invention, it is possible to improve adhesive force of the lower substrate 110 and the encapsulation substrate 210 by expanding the sealant 310 through several expanded parts 310b while preventing a defect from being generated in the voltage transmission electrode 197, thereby improving adhesion reliability and strength of the display device 1. It is possible to further improve the strength of the display device 1 by increasing an area and/or the number of expanded parts 310b of the sealant 310 or by evenly arranging the expanded parts 310b in the peripheral areas PA1 and PA2.

In some embodiments, the expanded part 310b of the sealant 310 and the contact part Cnt of the voltage transmission electrode 197 are alternately arranged in the peripheral areas PA1 and PA2 so that it is not necessary to increase an area of the sealant 310 in order to improve adhesion reliability. Accordingly, it is not necessary to increase the peripheral areas PA1 and PA2 of the display device 1 in order to increase an area of the sealant 310 so that it is possible to improve strength of the display device 1 and secure design competitiveness by decreasing an area of a bezel area of the display device.

In contrast to the above description, the sealant 310 positioned in the peripheral areas PA1 and PA2 adjacent to the lower edge E2 of the encapsulation substrate 210 may include the alternately arranged expanded part 310b and non-expanded part 310c, and the voltage transmission electrode 197 may include the expanded part 197b and the non-expanded part 197c, which are alternately arranged corresponding to (e.g., in accordance with) the expanded part 310b and the non-expanded part 310c.

Display devices according to example embodiments of the present invention will be described with reference to FIGS. 8 and 9, respectively, together with the aforementioned drawings. The same constituent elements as those of the aforementioned example embodiment are denoted by the same reference numerals, and the same description will be omitted.

Figure 8:
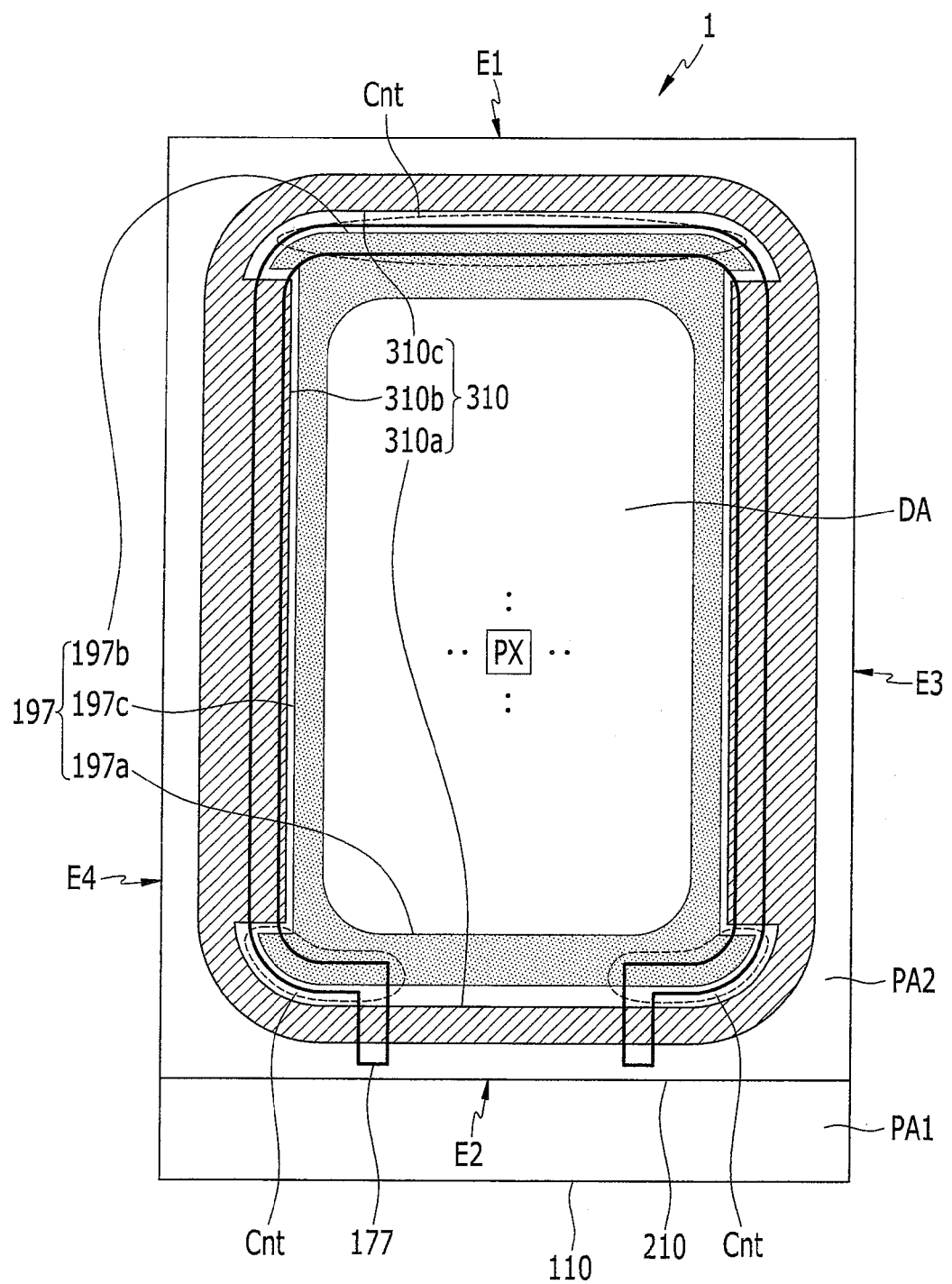
FIGS. 8 and 9 are top plan views of a display device according to an example embodiment of the present invention.
Figure 9:
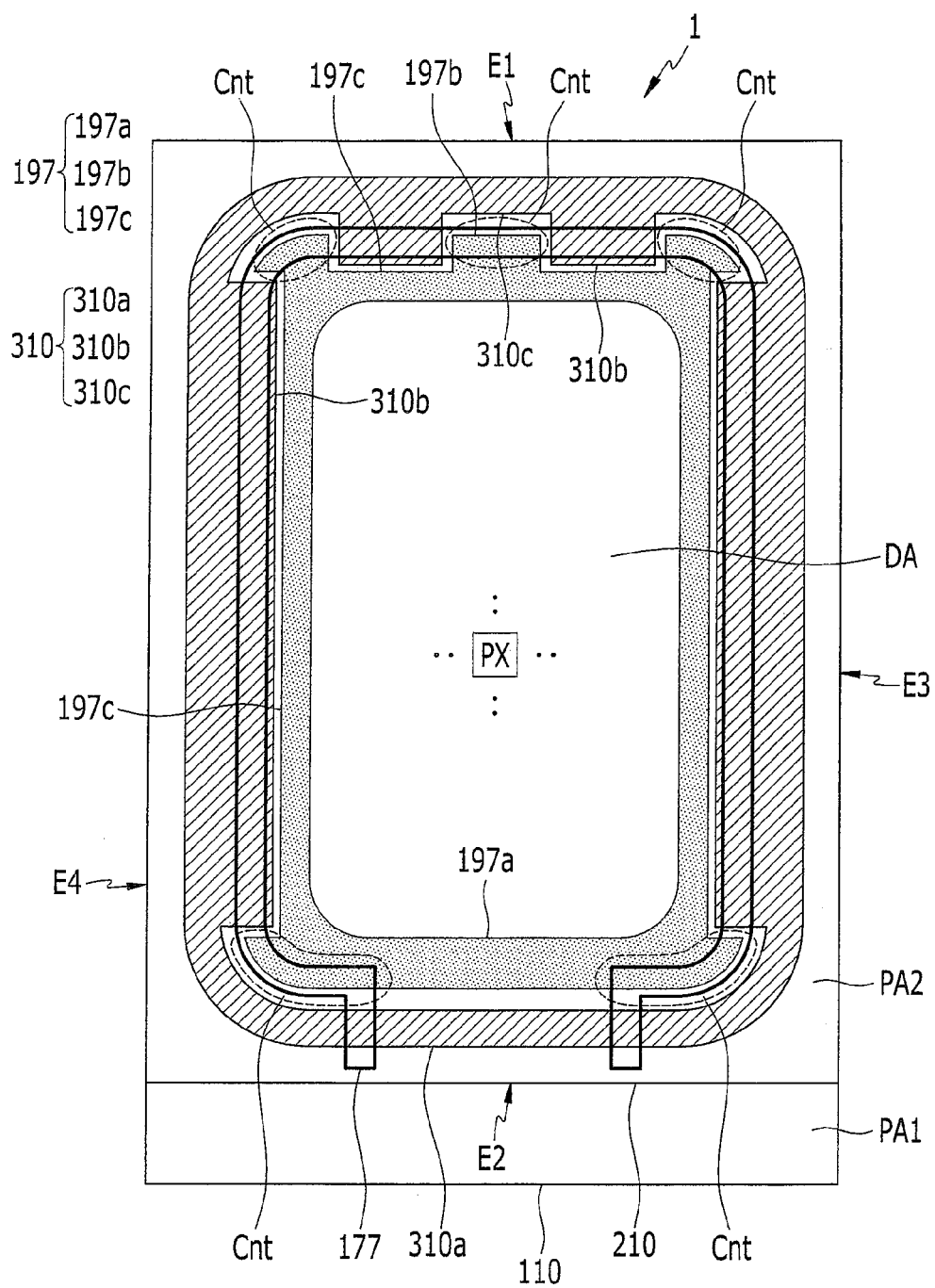

FIGS. 8 and 9 are top plan views of display devices according to example embodiments of the present invention, respectively.

The example embodiment illustrated in FIG. 8 is mostly the same as the display device according to the aforementioned example embodiment, but shapes of a sealant 310 and a voltage transmission electrode 197 may be different.

According to the present example embodiment, one expanded part 310b of the sealant 310 is positioned in peripheral areas PA1 and PA2 adjacent to a right edge E3 of an encapsulation substrate 210, and one expanded part 310b of the sealant 310 may be positioned in the peripheral areas PA1 and PA2 adjacent to a left edge E4 of the encapsulation substrate 210. Accordingly, each one non-expanded part 197a of the voltage transmission electrode 197 may be positioned in the peripheral areas PA1 and PA2 adjacent to the right edge E3 and the left edge E4 of the encapsulation substrate 210. The expanded part 310b of the sealant 310 may overlap a voltage transmission line 177.

In some embodiments, a width of the expanded part 310b of the sealant 310 positioned in the peripheral areas PA1 and PA2 adjacent to the right edge E3 and the left edge E4 of the encapsulation substrate 210 may be uniform, and a width of a non-expanded part 197 of the voltage transmission electrode 197 may be uniform.

In some embodiments, one non-expanded part 310c of the sealant 310 and one expanded part 197b of the voltage transmission electrode 197 facing the non-expanded part 310c of the sealant 310 may be positioned in the peripheral areas PA1 and PA2 adjacent to an upper edge E1 of the encapsulation substrate 210. The expanded part 197b of the voltage transmission electrode 197 is in contact with the voltage transmission line 177 to form a contact part Cnt together with the voltage transmission line 177.

In some embodiments, a width of the non-expanded part 310c of the sealant 310 positioned in the peripheral areas PA1 and PA2 adjacent to the upper edge E1 of the encapsulation substrate 210 may be uniform, and a width of the expanded part 197 of the voltage transmission electrode 197 may be uniform.

In some embodiments, an extended part 310a of the sealant 310 and an extended part 197a of the voltage transmission electrode 197 may be positioned in the peripheral areas PA1 and PA2 adjacent to a lower edge E2 of the encapsulation substrate 210. The extended part 310a of the sealant 310 may have a uniform width, and the extended part 197a of the voltage transmission electrode 197 may also have a uniform width. A part of the extended part 197a of the voltage transmission electrode 197 is in contact with the voltage transmission line 177 to form a contact part Cnt together with the voltage transmission line 177.

According to an example embodiment of the present invention, each one of the expanded part 310b of the sealant 310 may exist at a side at which a pad part of the lower substrate 110 is not positioned. That is, the peripheral areas PA1 and PA2 around the right edge E3 and the left edge E4 among the edges E1 to E4 of the encapsulation substrate 210, and the expanded part 310b of the sealant 310 formed around each of the edges E3 and E4 may be elongated along the corresponding edge E3 and E4. Accordingly, the expanded part 310b of the sealant 310 is elongated around the left edge and the right edge of the display device 1, so that it is possible to increase an entire area of the sealant 310, and evenly enhance adhesive force between the lower substrate 110 and the encapsulation substrate 210, thereby improving strength of the display device 1.

In the present example embodiment, the contact part Cnt of the voltage transmission line 177 and the voltage transmission electrode 197 may be positioned around the upper edge E1 and the lower edge E2 of the encapsulation substrate 210. The contact part Cnt positioned around the upper edge E1 may be elongated in a horizontal direction (as oriented in FIGS. 8 and 9).

The example embodiment illustrated in FIG. 9 is mostly the same as the display device according to the aforementioned example embodiment, but shapes of a sealant 310 and a voltage transmission electrode 197 may be different.

According to the present example embodiment, one expanded part 310b of the sealant 310 is positioned in peripheral areas PA1 and PA2 adjacent to a right edge E3 of an encapsulation substrate 210, and one expanded part 310b of the sealant 310 may be positioned in the peripheral areas PA1 and PA2 adjacent to a left edge E4 of the encapsulation substrate 210. Accordingly, each one of the non-expanded part 197a of the voltage transmission electrode 197 may be positioned in the peripheral areas PA1 and PA2 adjacent to the right edge E3 and the left edge E4 of the encapsulation substrate 210. The expanded part 310b of the sealant 310 may overlap a voltage transmission line 177.

In some embodiments, a width of the expanded part 310b of the sealant 310 positioned in the peripheral areas PA1 and PA2 adjacent to the right edge E3 and the left edge E4 of the encapsulation substrate 210 may be uniform, and a width of an non-expanded part 197 of the voltage transmission electrode 197 may be uniform.

At least one expanded part 310b and at least one non-expanded part 310c of the sealant 310 may be alternately arranged along an upper edge E1 in the peripheral areas PA1 and PA2 adjacent to the upper edge E1 of the encapsulation substrate 210. In the peripheral areas PA1 and PA2 around the upper edge E1, an inner border of the sealant 310 may be provided with embossings or have a quadrangular sawtooth shape.

At least one expanded part 197b and at least one non-expanded part 197c of the voltage transmission electrode 197 may be alternately arranged along the upper edge E1 in the peripheral areas PA1 and PA2 adjacent to the upper edge E1 of the encapsulation substrate 210. In the peripheral areas PA1 and PA2 around the upper edge E1, an outer border of the voltage transmission electrode 197 may be provided with embossings or have a quadrangular sawtooth shape.

The expanded part 197b of the voltage transmission electrode 197 may be expanded toward the voltage transmission line 177, and a part of the expanded part 197b is in contact with the voltage transmission line 177 to form the electrically and physically connected contact part Cnt. The non-expanded part 197c of the voltage transmission electrode 197 may not overlap the voltage transmission line 177.

The expanded part 197b of the voltage transmission electrode 197 faces the non-expanded part 310c of the sealant 310, and the non-expanded part 197c of the voltage transmission electrode 197 faces the expanded part 310b of the sealant 310 in the peripheral areas PA1 and PA2 adjacent to the upper edge E1 of the encapsulation substrate 210. The inner border of the sealant 310 may be substantially parallel to the outer border of the voltage transmission electrode 197, and arranged while being engaged with the outer border of the voltage transmission electrode 197. Embossings at the inner border of the sealant 310 and embossings at the outer border of the voltage transmission electrode 197 facing the embossings at the inner border of the sealant 310 may be formed while being engaged with each other.

An extended part 310a of the sealant 310 and an extended part 197a of the voltage transmission electrode 197 may be positioned in the peripheral areas PA1 and PA2 adjacent to a lower edge E2 of the encapsulation substrate 210. The extended part 310a of the sealant 310 may have a uniform width, and the extended part 197a of the voltage transmission electrode 197 may also have a uniform width.

According to an example embodiment of the present invention, each one of the expanded part 310b of the sealant 310 may exist at a side, at which a pad part of the lower substrate 110 is not positioned. That is, the peripheral areas PA1 and PA2 around the right edge E3 and the left edge E4 among the edges E1 to E4 of the encapsulation substrate 210, and the expanded part 310b of the sealant 310 formed around each of the edges E3 and E4 may be elongated along the corresponding edge E3 and E4. Accordingly, it is possible to increase an entire area of the sealant 310.

In some embodiments, the plurality of expanded parts 310b of the sealant 310 is positioned in the peripheral areas PA1 and PA2 adjacent to the upper edge E1 of the encapsulation substrate 210 so that it is possible to further increase an entire area of the sealant 310, and the expanded parts 310b of the sealant 310 are evenly arranged on the lower substrate 110 so that it is possible to evenly enhance adhesive force between the lower substrate 110 and the encapsulation substrate 210 to improve strength of the display device 1.

In the present example embodiment, the contact part Cnt of the voltage transmission line 177 and the voltage transmission electrode 197 may be positioned around the upper edge E1 and the lower edge E2 of the encapsulation substrate 210. The plurality of contact parts Cnt positioned around the upper edge E1 may be spaced apart from each other.

Several characteristics and effects of the display device 1 according to the aforementioend example embodiment illustrated in FIGS. 1 to 7 may be equally applied to the example embodiments illustrated in FIGS. 8 and 9.

The aforementioned example embodiments have been described based on the OLED display as an example, but the example embodiment of the present invention is not limited thereto and is applicable to various display devices.

While this invention has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

1: Display device
110: Lower substrate
111: Buffer layer
140: Gate insulating layer
154b: Semiconductor
177: Voltage transmission line
180a: First passivation layer
180b: Second passivation layer
197: Voltage transmission electrode
210: Encapsulation substrate
310: Sealant
360: Pixel defining layer
411: Transistor
711: Touch wire

What is claimed is:
1. A display device, comprising:
a lower substrate comprising a display area comprising a plurality of pixels and peripheral areas around the display area;
an encapsulation substrate facing the lower substrate, and comprising a plurality of edges facing different directions;
a sealant between the lower substrate and the encapsulation substrate, the sealant being at the peripheral areas;
a voltage transmission line at the peripheral areas, and being configured to transmit a common voltage; and
a voltage transmission electrode at the peripheral areas, and connected to the voltage transmission line to form at least one contact part,
wherein the sealant comprises a first expanded part and a first non-expanded part, the first non-expanded part having a smaller width than a width of the first expanded part, and
the contact part and the first expanded part are alternately arranged.

2. The display device of claim 1, wherein
the contact part and the first expanded part are alternately arranged at the peripheral areas adjacent to one edge among the plurality of edges of the encapsulation substrate.

3. The display device of claim 2, wherein
the plurality of edges comprises a first edge, a second edge, and a third edge, which are connected with each other, and
the contact part and the first expanded part are alternately arranged at the peripheral areas adjacent to each of the first edge, the second edge, and the third edge.

4. The display device of claim 2, wherein
the voltage transmission electrode comprises a second expanded part and a second non-expanded part, the second non-expanded part having a smaller width than a width of the second expanded part, and
the second expanded part is in contact with the voltage transmission line to form the at least one contact part.

5. The display device of claim 4, wherein
the first expanded part faces the second non-expanded part, and
the first non-expanded part faces the second expanded part.

6. The display device of claim 5, wherein
the plurality of edges further comprises a second edge and a third edge, and a fourth edge connecting the second edge and the third edge,
the sealant comprises a first extended part at the peripheral areas adjacent to the fourth edge, and
the voltage transmission electrode comprises a second extended part at the peripheral areas adjacent to the fourth edge.

7. The display device of claim 2, wherein
a first border of the sealant faces and is spaced from a second border of the voltage transmission electrode.

8. The display device of claim 7, wherein
the first expanded part of the sealant overlaps the voltage transmission line.

9. The display device of claim 2, further comprising:
a passivation layer between the voltage transmission line and the voltage transmission electrode, and having a contact hole exposing the voltage transmission electrode;
a pixel defining layer on the voltage transmission electrode; and
an opposing electrode on the pixel defining layer,
wherein the opposing electrode is connected with the voltage transmission electrode through the contact hole.

10. The display device of claim 9, wherein
the pixel defining layer comprises a peripheral part covering an end part of the voltage transmission electrode.

11. The display device of claim 2, wherein
the first expanded part is elongated along the one edge at the peripheral areas adjacent to the one edge.

12. The display device of claim 11, wherein
the plurality of edges comprises a first edge, a second edge, and a third edge which are connected with each other,
the first edge and the third edge are opposite each other with the display area interposed therebetween,
the contact part and the first expanded part are alternately arranged at the peripheral areas adjacent to the second edge, and
the first expanded part is elongated along each of the first edge and the third edge in the peripheral areas adjacent to each of the first edge and the third edge.

13. The display device of claim 11, wherein
the voltage transmission electrode comprises a second expanded part and a second non-expanded part, the second non-expanded part having a smaller width than a width of the second expanded part, and
the second expanded part is in contact with the voltage transmission line to form the at least one contact part.

14. The display device of claim 13, wherein
the first expanded part faces the second non-expanded part, and
the first non-expanded part faces the second expanded part.

15. The display device of claim 14, wherein
the plurality of edges further comprises a second edge and a third edge, and a fourth edge connecting the second edge and the third edge,
the sealant comprises a first extended part at the peripheral areas adjacent to the fourth edge, and
the voltage transmission electrode comprises a second extended part at the peripheral areas adjacent to the fourth edge.

16. The display device of claim 1, wherein
in the peripheral areas adjacent to at least one edge among the plurality of edges of the encapsulation substrate, the first expanded part is elongated along the at least one edge.

17. The display device of claim 16, wherein
the first non-expanded part is elongated along the at least one edge.

18. The display device of claim 17, wherein
the plurality of edges comprises a first edge, a second edge, and a third edge, which are connected with each other,
the first edge and the third edge are opposite each other with the display area interposed therebetween,
the first non-expanded part is elongated along the second edge at the peripheral areas adjacent to the second edge, and
the first expanded part is elongated along each of the first edge and the second edge at the peripheral areas adjacent to each of the first edge and the third edge.

19. The display device of claim 18, wherein
the voltage transmission electrode comprises a second expanded part and a second non-expanded part, the second non-expanded part having a smaller width than a width of the second expanded part, and
the second expanded part is in contact with the voltage transmission line to form the contact part.

20. The display device of claim 19, wherein
the first expanded part faces the second non-expanded part, and
the first non-expanded part faces the second expanded part.

* * * * *